United States Patent
Jun et al.

(10) Patent No.: US 6,544,802 B1
(45) Date of Patent: Apr. 8, 2003

(54) WAFER INSPECTION SYSTEM AND METHOD FOR SELECTIVELY INSPECTING CONDUCTIVE PATTERN DEFECTS

(75) Inventors: Chung-sam Jun, Hwasung-gun (KR); Pil-sik Hyun, Yongin (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 74 days.

(21) Appl. No.: 09/685,094

(22) Filed: Oct. 11, 2000

(30) Foreign Application Priority Data

Oct. 16, 1999 (KR) .............................. 99-44896

(51) Int. Cl.[7] .............................. H01L 21/00
(52) U.S. Cl. .............................. 438/14; 438/16
(58) Field of Search .............................. 438/16, 928, 14; 324/750–3, 537; 700/110; 430/30; 382/150, 149, 151; 356/394

(56) References Cited

U.S. PATENT DOCUMENTS 6,240,329 B1 * 5/2001 Sun

* cited by examiner

Primary Examiner—William David Coleman
(74) Attorney, Agent, or Firm—Volentine Francos, PLLC

(57) ABSTRACT

Wafer inspection system and method which are suitable for inspection of highly integrated semiconductor devices. The wafer inspection system includes an apparatus for selectively inspecting conductive pattern defects, which includes a sensor for scanning the surface of a wafer in a noncontact manner and an RLC circuit which is connected to the sensor and converts a signal obtained from the sensor into an electrical characteristic; and an image processing computer which is connected to the apparatus for selectively inspecting conductive pattern defects. Only conductive defects are selectively extracted, thereby increasing inspection efficiency.

13 Claims, 6 Drawing Sheets

WAFER INSPECTION SYSTEM AND METHOD FOR SELECTIVELY INSPECTING CONDUCTIVE PATTERN DEFECTS

BACKGROUND OF THE INVENTION

1. Field of the Invention

The present invention relates to an inspection system used during fabrication of semiconductor devices, and more particularly, to a wafer inspection system used for inspecting visual defects of a wafer.

2. Description of the Related Art

Fabrication yields of semiconductor devices continue to improve. One contributing factor is the improvement in the fabrication equipment itself and fabrication technology in general. In-line monitoring methods applied during the fabrication process have also been a big contributor to improved fabrication yields.

When conventional indirect monitoring methods are used for inspecting defects which arise during the semiconductor fabrication process, it is difficult to immediately take measures to deal with problems as they occur. However, with in-line monitoring, a wafer is inspected at every process step using a wafer inspection system. Accordingly, random or irregular equipment defects occurring during device fabrication can be immediately detected based on the inspection result obtained from the wafer inspection system at each process step so that a process can be immediately normalized even if defects occur. With in-line monitoring, defects are promptly discovered and measured, thereby maximizing yield. Moreover, waste in production cost caused by the occurrence of defects is reduced, thereby minimizing production cost.

During in-line monitoring, the wafer inspection system inspects visual defects of a wafer using a laser or an optic system to detect the sizes, shapes, colors, density and positions of defects and defect clusters on the wafer.

FIG. 1 is a schematic view for explaining a data processing method of a wafer inspection system using a conventional optical image. Referring to FIG. 1, an image of a wafer 10, which has a conductive pattern such as a metal pattern or an impurity doped polysilicon pattern, is sensed by an image sensor 30 using an optic system 20 in step 40. To facilitate digital processing with a computer, the sensed image is converted from an analog signal to a digital signal in step 50. The digitized image is filtered and compared with a reference image by an image processing computer 60 to extract defects contained in the image.

Specifically, the image processing computer 60 detects the sizes, colors and shapes of the extracted defects and identifies the density and positions of the defects. In accordance with the image which is obtained by completing the identification of the defects, the defects are clustered and classified in a review station 70, which is provided in an in-line or an off-line manner with respect to the wafer inspection system. After finishing the classification of the defects, a defect file 80 is generated for the wafer 10 which is under inspection. The defect file 80 is used for fabrication process monitoring or control.

FIG. 2 is a plan view for explaining a defect sensing method in a wafer inspection system using a conventional optical image. Referring to FIG. 2, an image processing computer using an optical system (such as described for FIG. 1) adopts a method of comparing an image 10a of a wafer to be inspected, with a reference image 10b. A conductive pattern image 71, which is normally formed on a chip, in the reference image 10b counterbalances that of the image 10a to be inspected so that only abnormal defect images will be extracted. Then, the number and locations of the extracted defects are sensed. After comparing and counterbalancing the two images 10a and 10b, four defects 65, 67, 69 and 73 are extracted as a whole in FIG. 2.

The defects 65, 67, 69 and 73 are classified into two categories: fatal defects which directly influence the operation of a chip formed on a wafer, and non-fatal defects whose influence is relatively slight. In other words, there exists a conductive pattern defect, e.g., the defect 73, which causes shorting to occur between the conductive patterns and makes the operation of a chip impossible, and non-conductive pattern defects, e.g., the defects 65, 67 or 69, which are removable through succeeding processes such as a cleaning process and/or forced air blowing processes.

This conventional wafer inspection system has the following problems. Primarily, in some cases, hundreds to tens of thousands of non-fatal defects may be contained in an image to be inspected. These non-fatal defects are identified and classified at a review station using a microscope or a scanning electron microscope (SEM). Moreover, large variations can occur during operations depending on an operators' skills and experience. In addition, too much time, effort and cost are required, thereby decreasing the inspection efficiency of a wafer inspection system.

In the meantime, since the minimum size of an image defect which can be sensed by an optic system is limited to 0.1–0.2 $\mu$m, it becomes more difficult to identify and extract defects as semiconductor devices become more highly integrated. If the size of a pixel of an image is decreased to solve the resolution problem in a wafer inspection system for highly integrated semiconductor devices, the throughput time of an image processing computer will be increased, so that the operating efficiency of the wafer inspection system may be decreased.

SUMMARY OF THE INVENTION

To solve the above problems, it is an objective of the present invention to provide a wafer inspection system for selectively inspecting conductive pattern defects by extracting visual defects depending on the quality of defects contained in a conductive pattern on a wafer, without using an optical system or a laser system, thereby improving the operating efficiency of the equipment.

It is another objective of the present invention to provide an inspection method using the wafer inspection system for selectively inspecting conductive pattern defects.

Accordingly, to achieve the first objective, there is provided a wafer inspection system including an apparatus for selectively inspecting conductive pattern defects, which includes a sensor for scanning the surface of a wafer in a noncontact manner and an RLC circuit which is connected to the sensor and converts a signal obtained from the sensor into an electrical characteristic signal. An image processing computer, which is connected to the apparatus, selectively inspects conductive pattern defects. Preferably, the wafer includes a conductive pattern and the sensor is a capacitor sensor.

In the apparatus for selectively inspecting conductive pattern defects, the electrical characteristic is obtained from the variation of resonance frequency. The electrical characteristic signal can be any of the group consisting of voltage, current and power characteristics. Accordingly, it is preferable that the RLC circuit includes a detector for detecting the variation of the electrical characteristic and an alternating current voltage source.

The image processing computer converts the electrical characteristic signal, which is received from the apparatus for selectively inspecting conductive pattern defects, into a two dimensional image and processes the two dimensional image. The image processing computer may include a review station for performing classification with respect to the image processing results.

To achieve the other objective, there is provided a method for selectively inspecting conductive pattern defects using a wafer inspection system. Primarily, a wafer having a conductive pattern is positioned in the wafer inspection system. The wafer is scanned using a sensor of an apparatus for selectively inspecting conductive pattern defects. A signal obtained from the sensor is converted into an electrical characteristic signal using an RLC circuit of the apparatus for selectively inspecting conductive pattern defects. The variation of the electrical characteristic signal is converted into a two dimensional image and defects are finally detected using an image processing computer. Preferably, the sensor is a capacitor sensor and the capacitor sensor scans the wafer in a noncontact manner.

It is preferable that the defects processed in the image processing computer are finally classified in a review station which is provided in an in-line or off-line manner.

According to the present invention, when inspecting a wafer having a conductive pattern using a wafer inspection system, only conductive pattern defects, which can be fatal to chips on the wafer, are selectively sensed, thereby reducing time, human power and cost which are required for checking and classifying nonconductive defects, which do not significantly influence the operation of a circuit on chip. In addition, instead of depending on sensing images of entire defects, the present invention senses only conductive pattern defects using an electrical signal, thereby optimally implementing a wafer inspection system suitable for highly integrated semiconductor devices in which detection of defects of minute sizes is required, without regard to the improvement of resolution.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

In this description, the term, "electrical characteristic signal" using resonance frequency has a broad meaning and is not to be construed as limited to a voltage characteristic as will be explained in an embodiment below. In other words, in the embodiment below, the voltage characteristic is exemplified and explained, but one of ordinary skill in the art would understand that an embodiment employing a power or a current characteristic may be utilized without undue experimentation. Likewise, for the sensor, a capacitor sensor can also be replaced with other like means. Moreover, although the RLC circuit is depicted as a serial embodiment, a parallel structure may also be utilized. Accordingly, the embodiments set forth herein should not be construed to limit the present invention.

Figure 1:
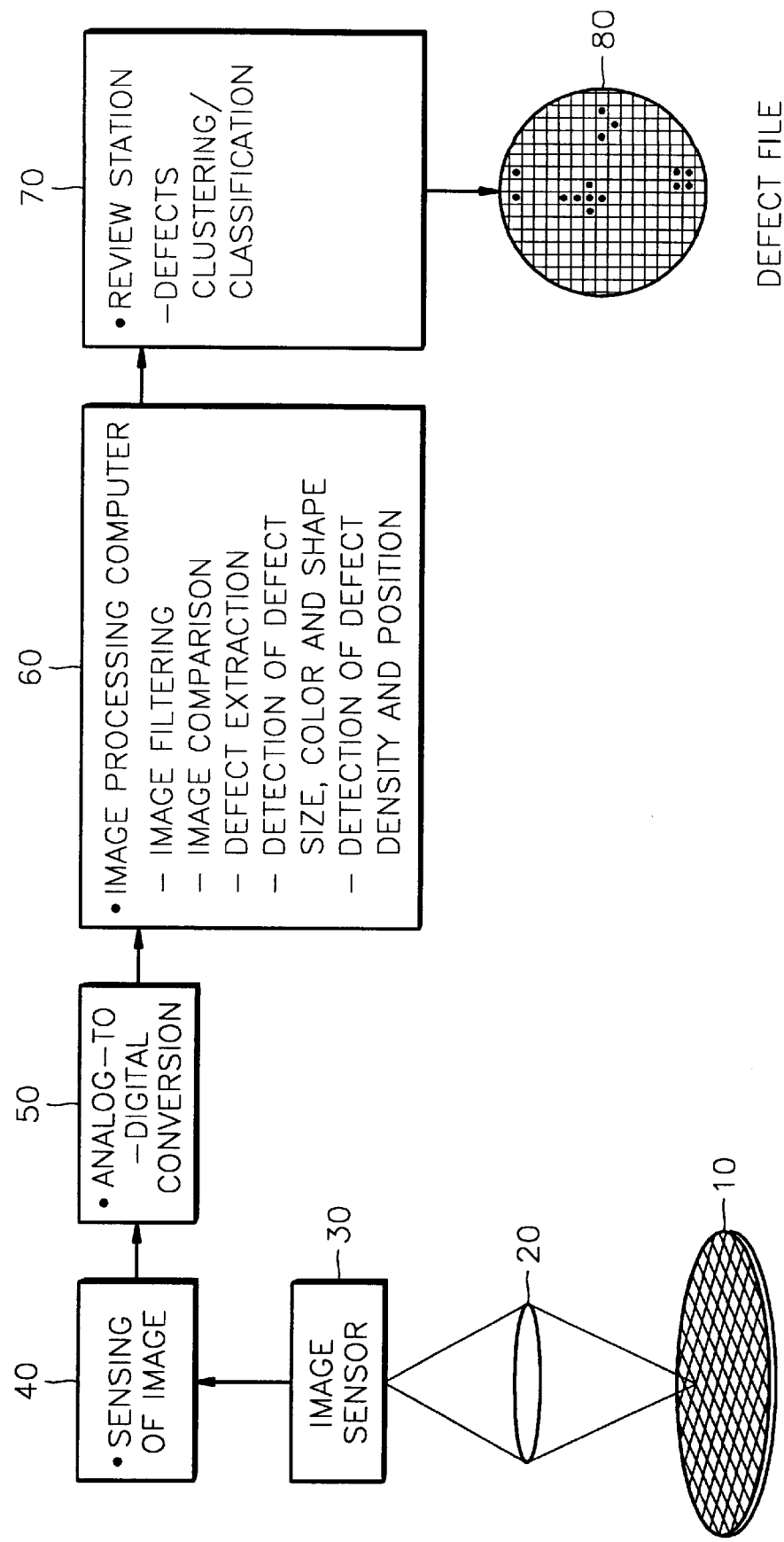
FIG. 1 is a schematic view for explaining a data processing method of a wafer inspection system using a conventional optical image.
Figure 2:
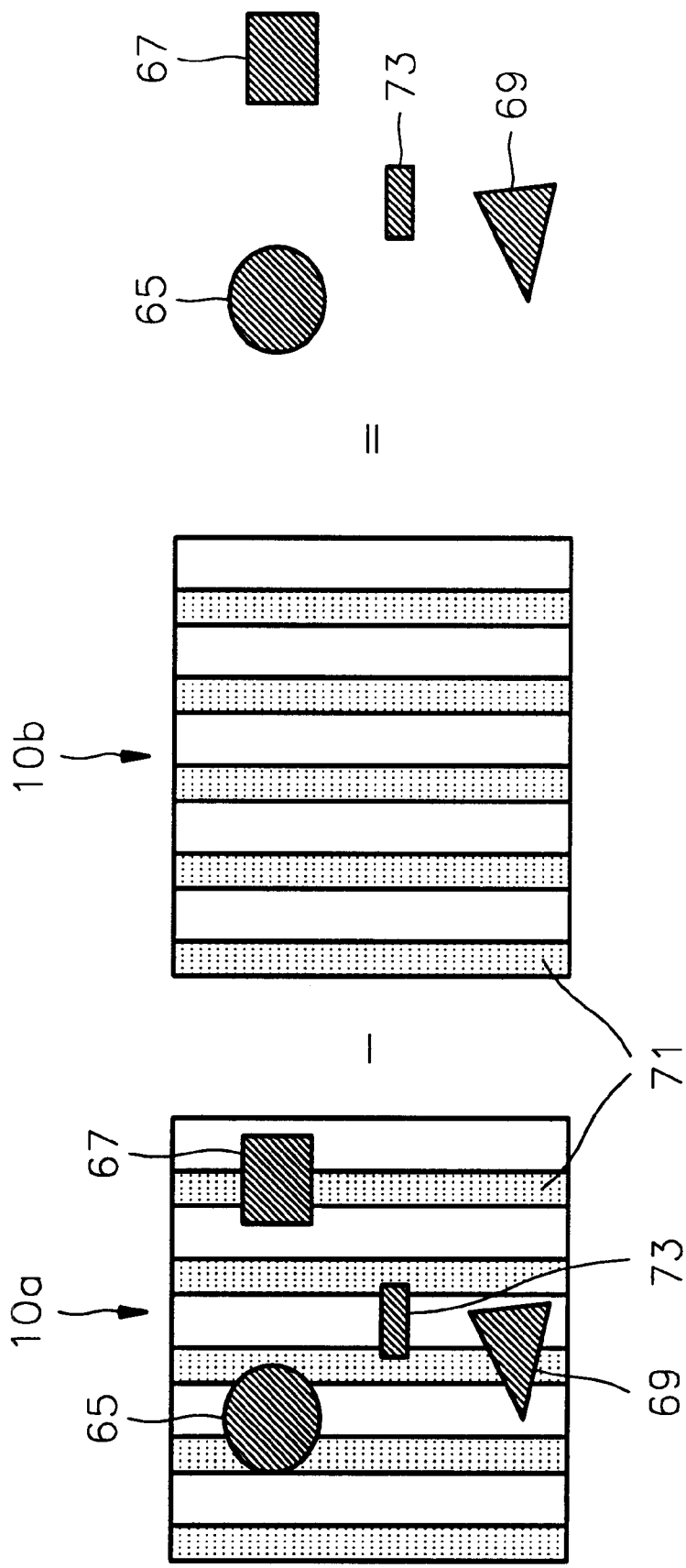
FIG. 2 is a plan view for explaining a defect sensing method in a wafer inspection system using a conventional optical image.
Figure 3:
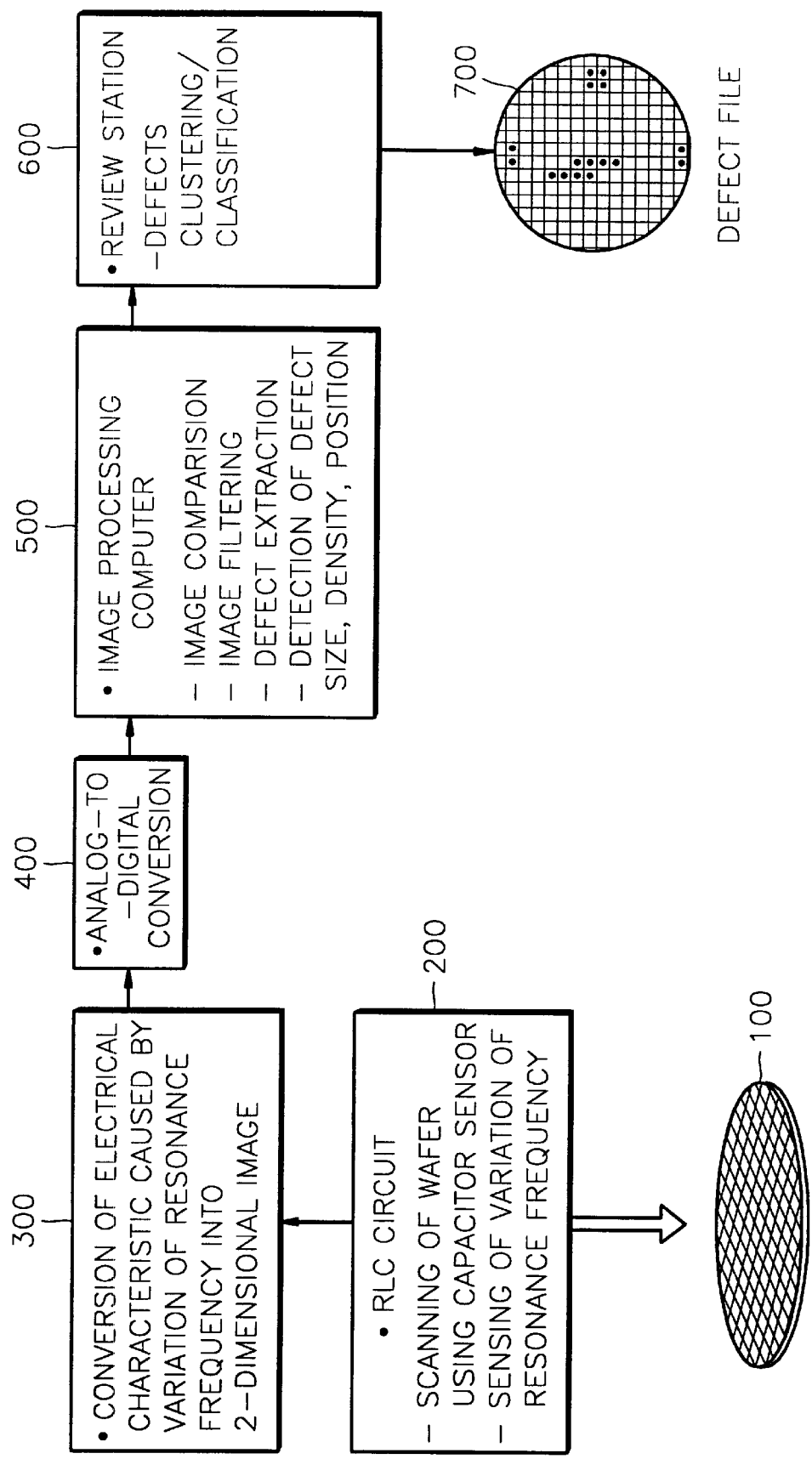
FIG. 3 is a schematic view for explaining a data processing method of a wafer inspection system including an RLC circuit according to the present invention.

FIG. 3 is a schematic view for explaining a data processing method of a wafer inspection system including an RLC circuit according to the present invention. Broadly defined, the wafer inspection system of the present invention selectively senses only those visual defects on a wafer 100 that affect conductivity.

In step 200, an RCL circuit scans the wafer 100 using a capacitor sensor which senses the variation of resonance frequency. In step 300, the variation of an electrical characteristic signal caused by the variation of the resonance frequency, i.e., the variation of voltage, current or power, is processed into a two dimensional image. In step 400, the image is converted from an analog state into a digital state to facilitate digital processing in a computer.

In step 500 the two dimensional image of the electrical signal is filtered and compared with a reference image by an image processing computer to extract only defects affecting conductivity, without detecting those defects that do not affect conductivity. Then, the number, density and positions of the conductive pattern defects are ascertained.

In step 600, the defects are clustered and classified in a review station to generate a defect file 700 including the states of the conductive defects. The defect file 700 is applied to the fabrication process.

Figure 4:
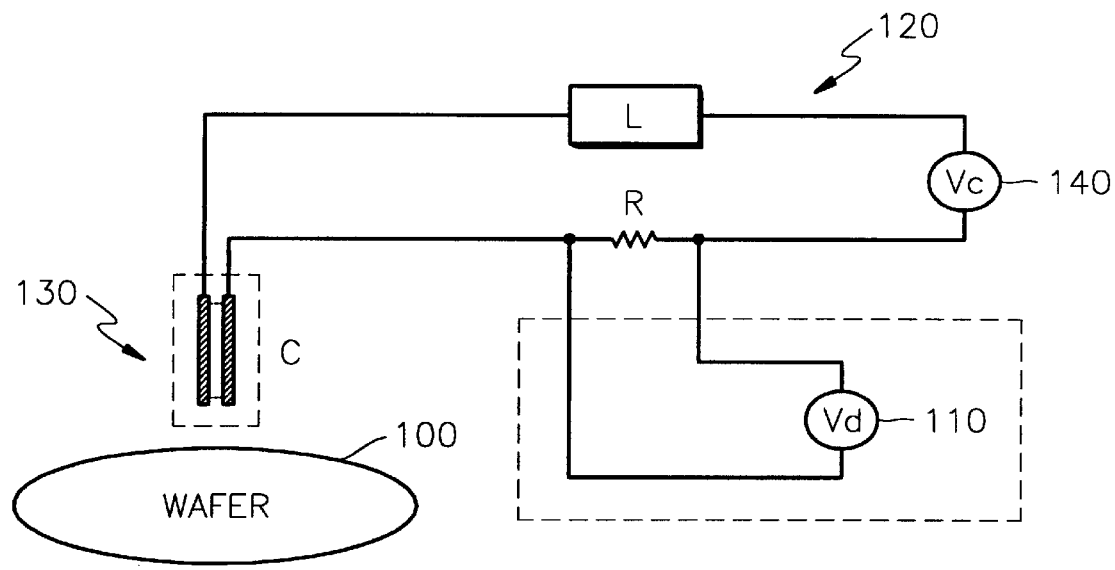
FIG. 4 is a schematic view for explaining an apparatus for selectively inspecting conductive pattern defects in a wafer inspection system according to the present invention.

FIG. 4 is a schematic view for explaining an apparatus for selectively inspecting conductive pattern defects in a wafer inspection system according to the present invention. Referring to FIG. 4, the apparatus includes an RLC circuit 120, an alternating current voltage source 140, a detector 110 and a capacitor sensor 130. In this embodiment, the detector 110 is designed to detect a voltage characteristic, but the detector can also be designed to detect current or electric power characteristics. A resistor R, a capacitor C and an inductor L are arranged in series. A voltage which is applied to the alternating current voltage source 140 is preferably an alternating current voltage less than 5 V. The voltage Vc of the alternating current voltage source 140 has the same frequency as that of the voltage Vd of the detector 110.

Figure 5:
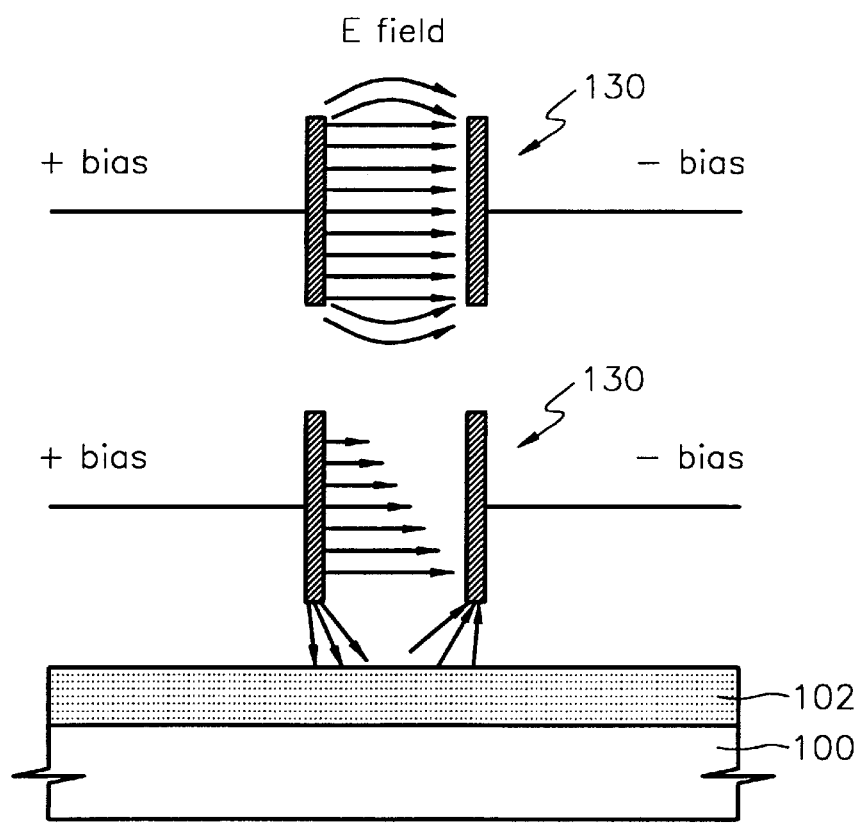
FIG. 5 is a side sectional view of a capacitor sensor in an apparatus for selectively inspecting conductive pattern defects.

FIG. 5 is a side sectional view of the capacitor sensor 130 in the apparatus for selectively inspecting conductive pattern defects of FIG. 4. Referring to FIG. 5, the capacitor sensor has two conductive metal plates (electrodes) separated by an epoxy, which is a dielectric. As shown in FIG. 4, once alternating current voltage is applied to the RLC circuit 120, resonance frequency is generated. In this condition, when scanning a wafer 100 having a conductive pattern 102 using the capacitor sensor 130, the capacitance and inductance of the capacitor sensor 130 are varied, thereby varying the resonance frequency in the RLC circuit.

The variation of the resonance frequency varies the electrical characteristic signal of the RLC circuit so that the root mean square (Vrms) voltage Vd, which is measured at the detector 110 of FIG. 4, varies. However, if a film formed on a wafer 100 is a dielectric without conductivity, this variation is very slight.

Figure 6:
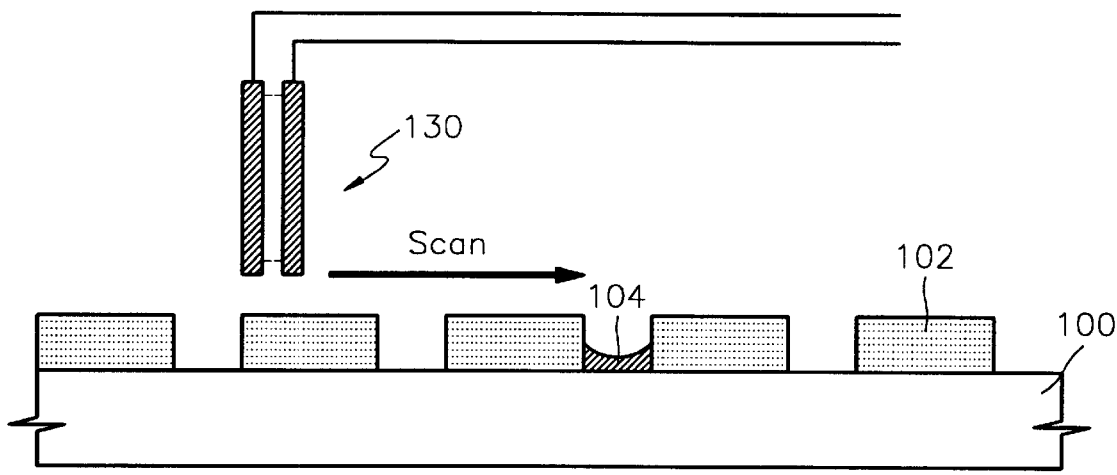
FIG. 6 is a side sectional view for showing how a capacitor sensor scans a conductive pattern on a wafer.

FIG. 6 is a side sectional view for showing how the capacitor sensor 130 scans over a conductive pattern 102 on a wafer 100 in a noncontact manner. The resonance frequency of the capacitor sensor 130 varies according to the characteristic of a film formed on the wafer 100 or a defect such as a metal bridge 104. The variation of the resonance frequency varies an electrical characteristic signal, i.e., a Vrms value.

Figure 7:
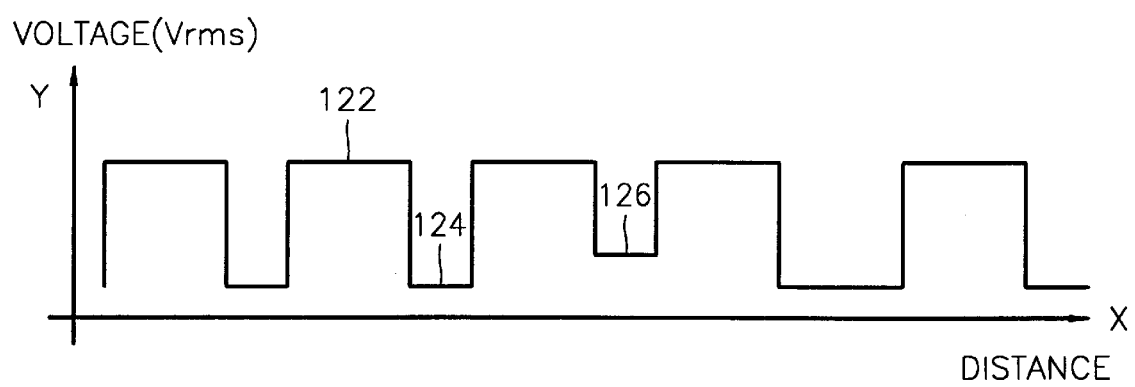
FIG. 7 is a graph for showing a voltage characteristic among electrical characteristics which can be obtained when the capacitor sensor of FIG. 6 scans a conductive pattern.

FIG. 7 is a graph for showing a voltage characteristic among electrical characteristics which can be obtained when the capacitor sensor of FIG. 6 scans a conductive pattern. Referring to FIG. 7, the X-axis indicates the scanning distance of the capacitor sensor and the Y-axis indicates an electrical characteristic, i.e., the variation of a voltage Vrms. FIG. 7 shows that a voltage characteristic 122 of a conductive pattern formed on a wafer and a voltage characteristic 124 of a nonconductive portion on the wafer alternately appear. However, the voltage characteristic appears in an abnormal state 126 at the portion of a conductive defect such as a metal line bridge on the wafer. The abnormal voltage characteristic is compared with a standard voltage characteristic without defects to extract only conductive defects. Since the sensor according to the present invention does not detect nonconductive defects, the nonconductive defects are not extracted as defects even though they exist on a wafer. The waveform shown in FIG. 7 is for illustrative purposes only, and the shape of the waveform can vary depending on the design of an RLC circuit and the method of extracting the waveform.

Figure 8:
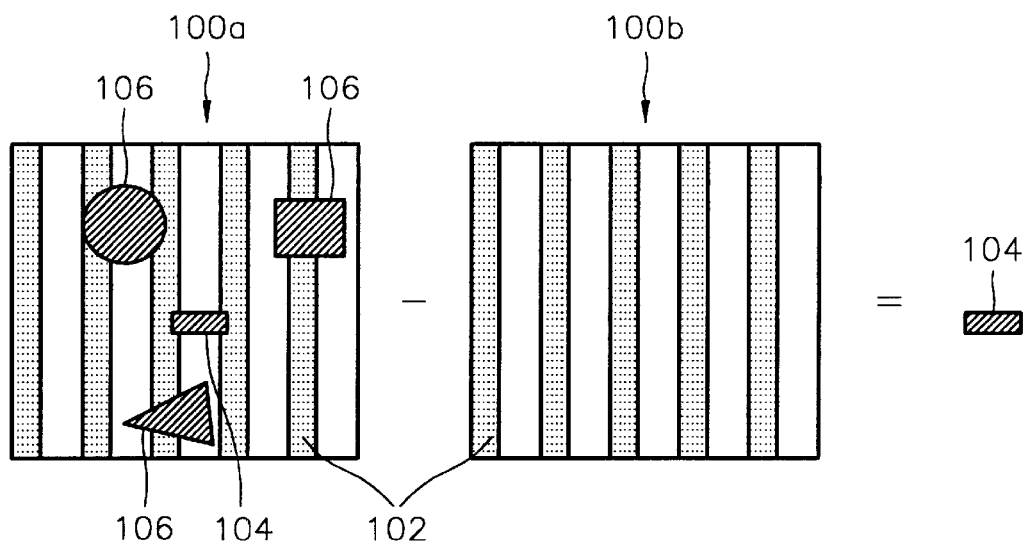
FIG. 8 is a plan view for explaining a defect inspection method of a wafer inspection system including an apparatus for selectively inspecting conductive pattern defects according to the present invention.

FIG. 8 is a plan view for explaining a defect inspection method of a wafer inspection system including an apparatus for selectively inspecting conductive pattern defects according to the present invention. Referring to FIG. 8, a wafer 100a, including a conductive defect 104 and nonconductive defects 106, and a wafer 100b without defects undergo the inspection of visual defects in a wafer inspection system according to the present invention. An electrical characteristic image obtained using an RLC circuit and a capacitor sensor is processed in an image computer. A conductive pattern 102 image of the wafer 100b without defects counterbalances a conductive pattern 102 image of the wafer 100a to be inspected, and the conductive pattern 102 image of the wafer 100a is removed. Consequently, the nonconductive defects 106 are removed and only the conductive defect 104 is extracted.

Figure 9:
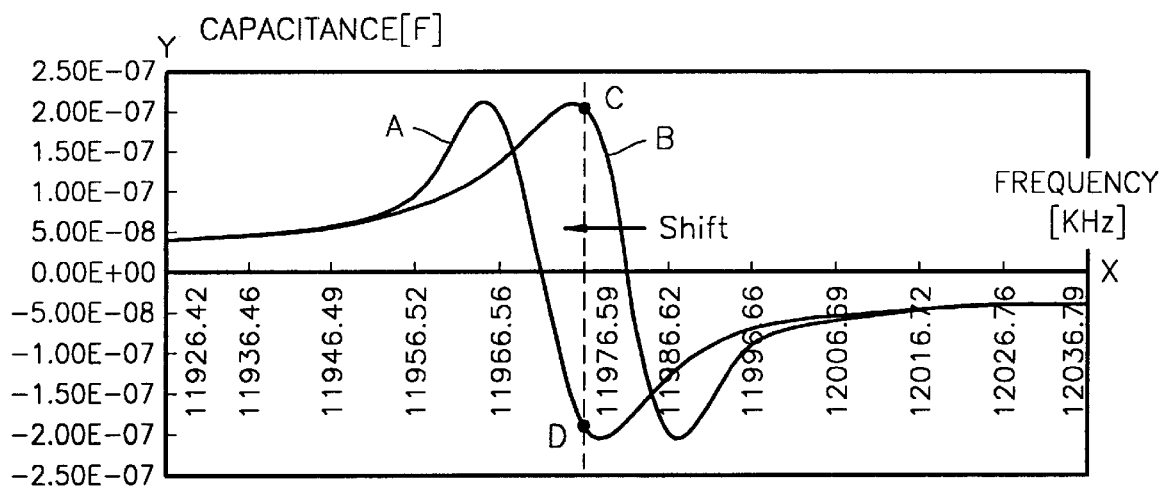
FIG. 9 is a graph for showing the variation of resonance frequency which is obtained at conductive pattern portions and non-conductive pattern portions using an apparatus for selectively inspecting conductive pattern defects.

FIG. 9 is a graph for showing the variation of resonance frequency which is obtained at conductive pattern portions and non-conductive pattern portions using an apparatus for selectively inspecting conductive pattern defects. Referring to FIG. 9, the X-axis indicates the variation of band frequency and the Y-axis indicates capacitance. A capacitor sensor used in a test had an aluminum plate, which was formed on a semiconductor substrate to a thickness of 8000 Å, as an electrode of a capacitor. An epoxy having a thickness of 20 μm was used as a dielectric film of the capacitor sensor. Two aluminum plates were bonded to each other by the epoxy. Once an alternating current voltage was applied to the capacitor sensor, the occurrence of resonance in the capacitor sensor itself was detected using an LCZ meter and the capacitor sensor was moved in a noncontact manner across a wafer having a stacked aluminum film to detect variation of resonance.

In the graph of FIG. 9, line B indicates the variation of capacitance when resonance occurs in the capacitor sensor itself. Line A indicates the variation of capacitance when resonance is generated when moving the capacitor sensor across the wafer having the stacked aluminum film. In the graph, line A is shifted down in frequency from the line B by about 10 KHz. When the scanning is repeated, the shift of frequency was repeated by a regular quantity. It was also confirmed that the shape of the line A or B has repeatability.

Accordingly, it was confirmed through the test that the shift of resonance frequency occurs when a capacitor sensor connected to an RLC circuit approaches a conductive pattern of a wafer. When frequency is fixed at an arbitrary value as represented by a doted line in FIG. 9 and when capacitance C and D, which are obtained as resultant values of scanning at the fixed frequency, are compared with each other, the difference between the two capacitances can be sensed. Based on such variation of the capacitance, conductive defects can be discriminated from nonconductive defects.

According to the present invention, when inspecting a wafer in a wafer inspection system, only conductive pattern defects such as doped polysilicon bridges and metal line bridges, which can be fatal to chips on the wafer, are selectively sensed, thereby reducing time, human power and cost which are required for checking nonconductive defects. In addition, the present invention senses conductive pattern defects using an electrical signal, thereby advantageously implementing a wafer inspection system suitable for highly integrated semiconductor devices in which detection of defects of minute sizes is required.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A wafer inspection system comprising:
   an apparatus for selectively inspecting conductive pattern defects, the apparatus comprising
      a sensor for scanning the surface of a wafer in a noncontact manner, and
      an RLC circuit connected to the sensor, the RLC circuit converting a signal obtained from the sensor into an electrical characteristic signal; and
   an image processing computer connected to the apparatus for processing the electrical characteristic signal and extracting only defects affecting conductivity.

2. The wafer inspection system of claim 1, further comprising a conductive pattern formed on the wafer.

3. The wafer inspection system of claim 1, wherein the sensor is a capacitor sensor.

4. The wafer inspection system of claim 1, wherein the electrical characteristic signal is obtained from the variation of resonance frequency in the apparatus for selectively inspecting conductive pattern defects.

5. The wafer inspection system of claim 1, wherein the RLC circuit comprises a detector for detecting variation of the electrical characteristic signal.

6. The wafer inspection system of claim 1, wherein the RLC circuit comprises an alternating current voltage source.

7. The wafer inspection system of claim 5, wherein the electrical characteristic signal is selected from the group consisting of voltage, current and power.

8. The wafer inspection system of claim 1, wherein the RLC circuit is includes a resistor, an inductor and a capacitor connected in series.

9. The wafer inspection system of claim 6, wherein voltage which is applied through the alternating current voltage source is less than 5 V.

10. The wafer inspection system of claim 1, wherein the image processing computer converts the electrical characteristic signal into a two dimensional image and processes the two dimensional image.

11. The wafer inspection system of claim 1, wherein the image processing computer further comprises a review station for classifying the defects affecting conductivity.

12. The wafer inspection system of claim 11, wherein the review station is integral with the image processing computer.

13. The wafer inspection system of claim 11, wherein the review station is housed separately and connected to the image processing computer.

* * * * *